United States Patent [19]

Sugita et al.

[11] 3,920,492

[45] Nov. 18, 1975

[54] PROCESS FOR MANUFACTURING A SEMICONDUCTOR DEVICE WITH A SILICON MONOCRYSTALLINE BODY HAVING A SPECIFIC CRYSTAL PLANE

[75] Inventors: Yoshimitsu Sugita, Kokubunji; Teruo Kato, Kodaira; Katsuro Sugawara, Kodaira; Masao Tamura, Tokorozawa, all of Japan

[73] Assignee: Hitachi, Ltd., Japan

[22] Filed: June 27, 1974

[21] Appl. No.: 483,837

Related U.S. Application Data

[62] Division of Ser. No. 120,289, March 2, 1971, Pat. No. 3,821,783.

[30] Foreign Application Priority Data

Mar. 2, 1970 Japan .............................. 45-17084

[52] U.S. Cl. .................... 148/175; 29/571; 29/576; 148/187; 357/34; 357/52; 357/60; 357/89; 427/93; 427/95

[51] Int. Cl.[2] .................. H01L 21/20; H01L 29/04; H01L 21/316

[58] Field of Search ........ 148/175, 187; 117/106 A, 117/201, 213; 357/60; 29/576, 571

[56] References Cited

UNITED STATES PATENTS

| | | | |
|---|---|---|---|
| 3,476,592 | 11/1969 | Berkenblit et al. | 117/201 |
| 3,480,491 | 11/1969 | Reisman et al. | 148/175 X |
| 3,556,875 | 1/1971 | Holloway et al. | 148/175 |
| 3,603,848 | 9/1971 | Sato et al. | 29/576 X |
| 3,612,960 | 10/1971 | Takeishi et al. | 357/60 |

OTHER PUBLICATIONS

Balk et al., "Low-Charge Silicon Surfaces for FET Fabrication" I.B.M. Tech. Discl. Bull., Vol. 11, No. 12, May 1969, p. 1633.

Bean et al., "Influence of Crystal Orientation – – – Silicon – – – Processing" Proc. IEEE, Vol. 57, No. 9, Sept. 1969, pp. 1469–1476.

Deal, B. E., "Oxidation of Silicon in Dry Oxygen, Wet Oxygen, and Steam" J. Electrochem, Soc., Vol. 110, No. 6, June 1963, pp. 527–533.

*Primary Examiner*—L. Dewayne Rutledge
*Assistant Examiner*—W. G. Saba
*Attorney, Agent, or Firm*—Craig & Antonelli

[57] ABSTRACT

A semiconductor device comprising a silicon monocrystalline body having a major flat surface having a specific crystallographic orientation deviating 2.5° to 15° from the [100] axis, preferably toward an axis, in the (100) plane, selected from the group consisting of 0° to 35° off one of the axes [010], [001], $[0\bar{1}0]$ and $[00\bar{1}]$.

8 Claims, 15 Drawing Figures

FIG. 3(a) θ=0°
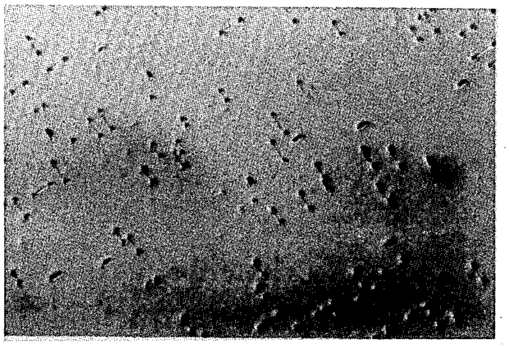
FIG. 3(d) θ=7°
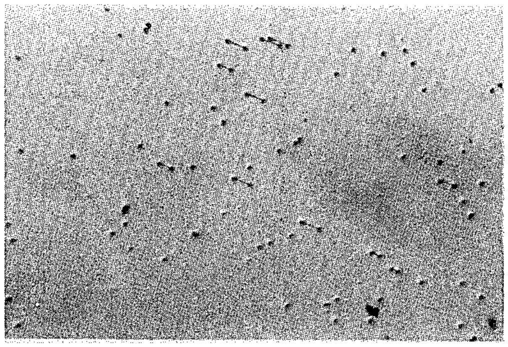
FIG. 3(b) θ=2.5
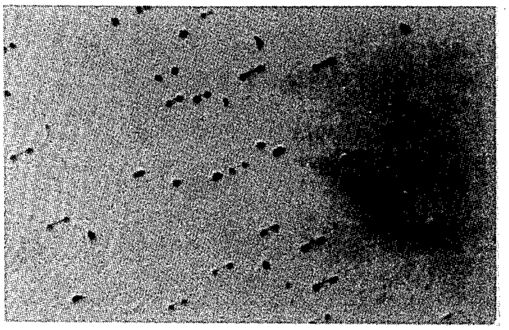
FIG. 3(e) θ=10°
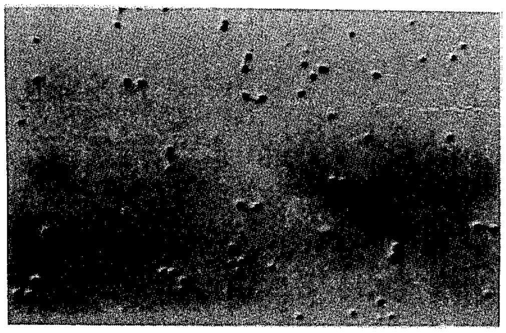
FIG. 3(c) θ=5°
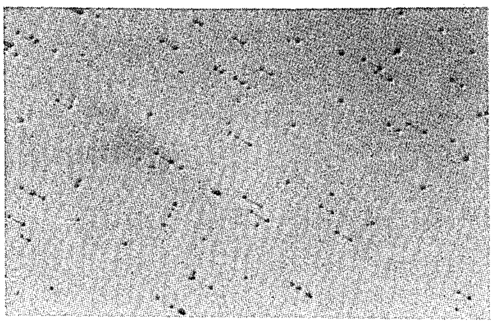

FIG. 4(a) θ=0°
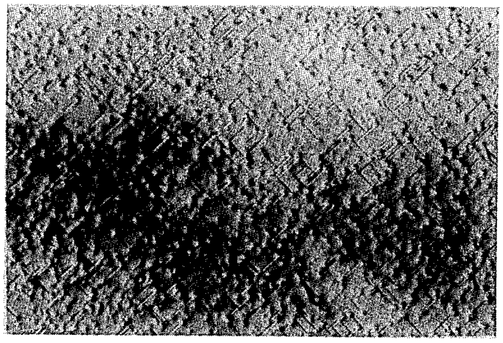
FIG. 4(b) θ=2.5°
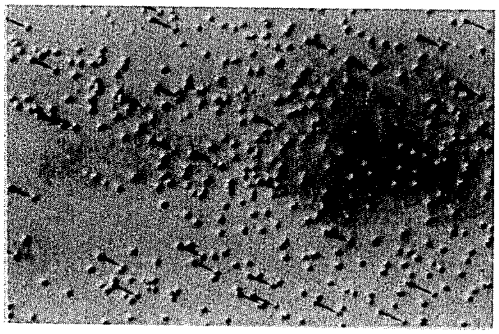
FIG. 4(c) θ=5°
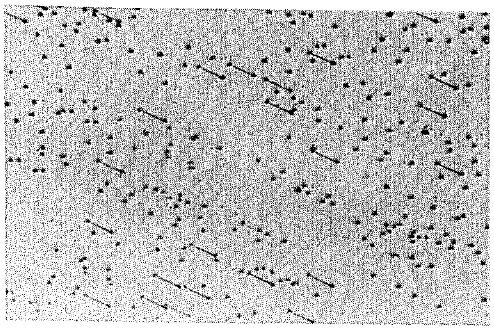
FIG. 4(d) θ=7°
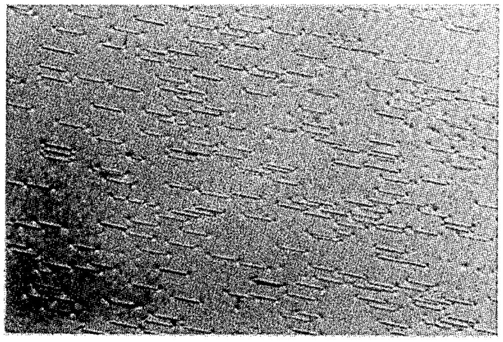
FIG. 4(e) θ=10°
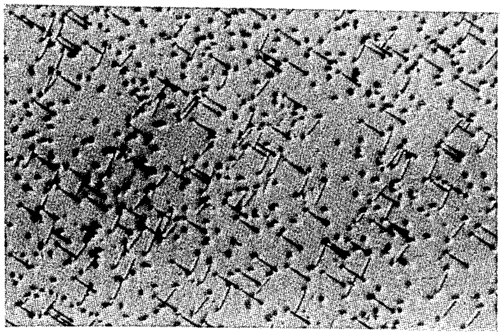

PROCESS FOR MANUFACTURING A SEMICONDUCTOR DEVICE WITH A SILICON MONOCRYSTALLINE BODY HAVING A SPECIFIC CRYSTAL PLANE

This is a division, of application Ser. No. 120,289, filed Mar. 2, 1971, now U.S. Pat. No. 3,821,783.

This invention relates to semiconductor material, particularly to silicon monocrystalline bodies having an improved major surface for semiconductor devices.

A silicon monocrystalline body having a surface lying parallel to the (100) plane, due to its low channel effect and other reasons, has been recently increasingly utilized. When a semiconductor device is manufactured from a silicon crystal body, thermal oxidation and other various treatments are usually applied to the surface of the crystal body during the manufacturing processes.

However, in the case of the thermal oxidation of the silicon crystal body having the (100) crystal plane, stacking faults occur on the silicon surface, as shown in FIGS. 3(*a*) and 4(*a*), which have harmful effects on the characteristics of the transistor, diode and the like. Such defects are particularly remarkable in the low noise transistors.

It is well known that thermal oxidation or annealing in a wet oxygen atmosphere of silicon single crystals causes stacking fault defects on the surface layers of the crystals. Also, it is commonly believed that water vapor or oxygen atmosphere associated with the strain centers, which are introduced during the surface treatment of the crystals or already present in pulled crystals in the form of precipitates of silicon dioxide, are responsible for the generation of these stacking fault defects. However, no clear account has been given of the more detailed causes.

In the formation of the oxide film ($SiO_2$) by means of thermal oxidation of the surface of the silicon crystal, wherein the silicon crystal body heated to a high temperature is placed in an oxidizing atmosphere, the oxidizing atmosphere containing water vapor is more widely used because it provides a faster oxidation rate than the oxidizing atmosphere containing no water vapor (dry oxidation). According to the experiment of the inventors, whereas the density of the stacking fault defects could be reduced by the control of the water vapor content since the stacking faults appear due at least in part to the oxidation in the oxidizing atmosphere containing water vapor (so called wet oxidation) of the silicon crystal body having the (100) crystal plane, it was not possible to completely prevent the generation of the stacking faults. Also, the oxidation time was undesirably prolonged. In addition, when a $SiO_2$ film adheres on the surface of the silicon crystal body because of the dry oxidation or silane decomposition, the high temperature treatment subsequent to the adhesion leads to the appearance of stacking faults, thereby rendering the essential solution of the problem unattainable.

A stacking fault is the disturbance of the stacking order of the silicon crystal lattice plane at a certain plane, e.g., at the (111) plane. There exists dislocations at the ends of this discontinuity, which are called partial dislocations. It has been practically observed that when this type of fault exists in the crystal body, the impurity atoms introduced by diffusion or impurity atoms which are already present in the crystal precipitate at the dislocations, or these dislocations, acting as a diffusion pipe, effect an extraordinary increase of the diffusion rate. It is known that when such dislocations pass across the PN junction, yielding of the reverse current-voltage characteristics of the junction occurring thereat due to the microplasma deteriorates the PN junction characteristics. (H. J. Queisser and A. Goetzberger, Philosophical Magazine, Volume 8, Page 1063, 1963). Also, the dislocations have a general property to act as a recombination center of the carrier, which particularly provides a problem when low noise characteristics are required.

The stacking faults are also formed when a (100) bulk silicon is exposed to hydrogen fluoride (HF), or a solution containing HF, for removing unwanted oxide films remaining on the crystal surfaces, etching and the like or hydrogen chloride (HCl) for vapor etching.

In view of the above problems, it is an object of the present invention to provide a silicon crystal body having a major surface which is free from stacking faults, without losing the characteristics of the (100) crystal plane.

Typically, the silicon monocrystalline body in accordance with the present invention has a major crystal surface having a crystallographic orientation of 2.5° to 15° off the [100] axis, particularly preferably the projection line of which in a (100) plane crosses an axis selected from the group consisting of the axes [010], [001], $[0\bar{1}0]$ and $[00\bar{1}]$ at an angle in a range of 0° to 35°. In other words, a silicon monocrystalline body has an improved major flat surface having a crystallographic orientation deviating 2.5° to 15° from the [100] axis, preferably toward an axis, in a (100) plane, selected from the group consisting of 0° to 35° off one of the axes [010], [001], $[0\bar{1}0]$ and $[00\bar{1}]$. Stacking fault defects in the surface of such silicon monocrystalline body after the thermal oxidation or HF rinsing or washing etc. are reduced or disappear. The invention is also effectively employed for an epitaxially grown silicon monocrystalline body.

The foregoing and other objects and advantages of the present invention will be apparent from the following detailed description in conjunction with the accompanying drawings, in which:

FIG. 1(*b*) is a sectional view of the hemispherical monocrystalline silicon taken along the axes $[0\bar{1}1]$ and $[0\bar{1}\bar{1}]$ in FIG. 1(*a*);

Figure 5:
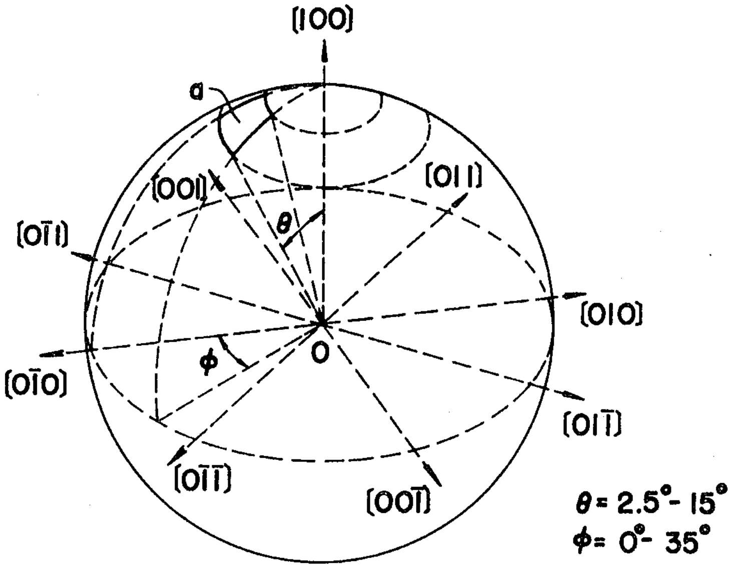
Figure 6:
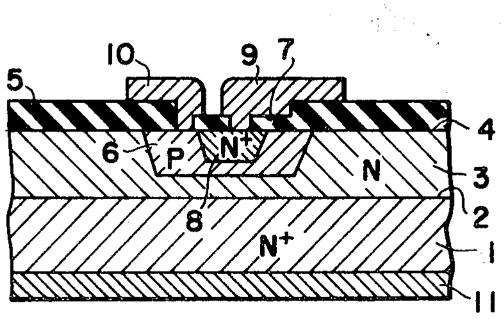

FIG. 3(*a*) to FIG. 3(*e*) are microphotographs showing stacking fault defects formed in silicon crystal surfaces each crystallographic orientation of which deviates 0°, 2.5°, 5°, 7°and 10° from the [100] axis toward the $[0\bar{1}\bar{1}]$ axis;

FIGS. 4(*a*) to 4(*e*) are microphotographs showing stacking fault defects formed in epitaxially grown monocrystalline silicon surfaces each crystallographic orientation of which deviates 0°, 2.5°, 5°, 7° and 10° from the [100] axis toward the $[0\bar{1}\bar{1}]$ axis;

FIG. 5 illustrates the range of crystal planes being free from the stacking fault defects; and FIG. 6 is a sectional view of an NPN transistor in accordance with the present invention, which employs the crystal plane having a crystallographic orientation deviating 4° from the [100] axis toward the [010] axis as its major surface.

According to the investigation of the inventors, the stacking fault defects appearing on a surface of silicon crystal body in parallel with the (100) plane after, for example, the removal of an oxide film thermally produced thereon and Sirtl etching for 50 seconds, are parallel to the intersection lines of the (100) plane and 4 (111) planes, that is, in the direction of [011] axis and the [01$\bar{1}$] axis, as shown in the photographs of FIGS. 3(*a*) and 4(*a*).

The relationship between the orientation of the crystal plane and the generation of the stacking fault defects become clear from the experiment described below. The experiment comprises forming a silicon crystal in a hemispherical configuration about the [100] axis, thermally oxidizing it in an oxidizing atmosphere containing water vapor and then removing the oxide film thus produced, and applying the Sirtl etching thereto to observe the degree of the generation of the stacking fault defects on the crystal planes due to the difference of the angle to the [100] axis.

Figure 1A:
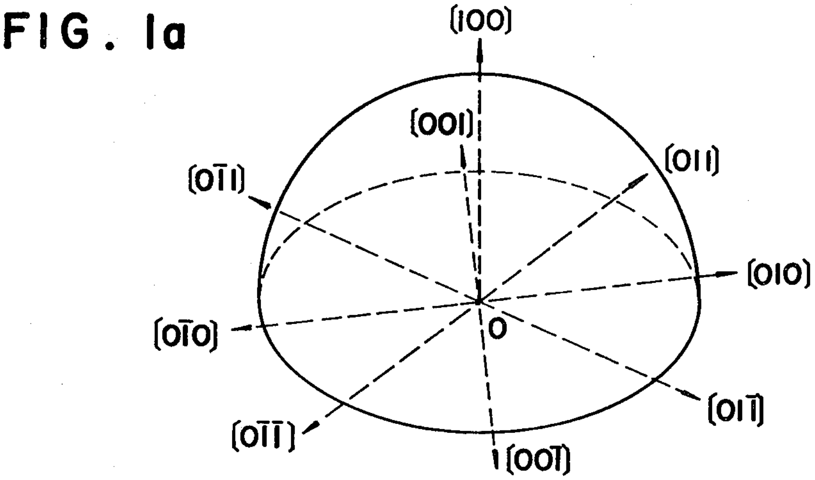
FIG. 1(*a*) illustrates a hemispherical monocrystalline silicon for observation of stacking faults in various planes of the spherical surface thereof.
Figure 1B:
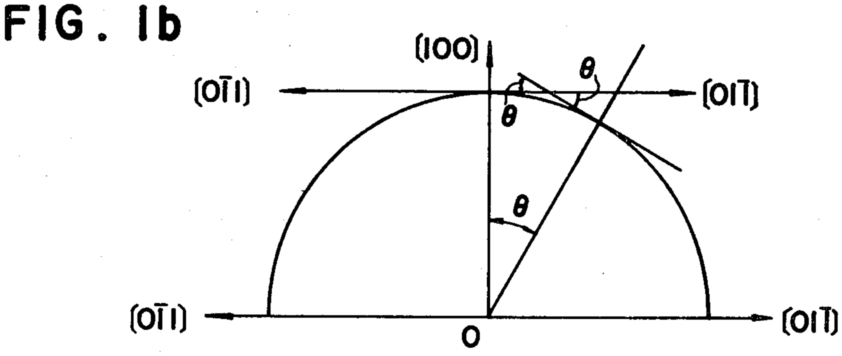

FIG. 1(*a*) shows the silicon crystal formed in a hemispherical configuration, wherein the radial lines from the point 0 indicate the crystal axes perpendicular to the [100] axis, as a consequence of crystallographic symmetry the crystal planes of the orthogonal crystal axes having crystallographically the same properties. FIG. 1(*b*) is the cross-sectional view of the hemispherical silicon crystal taken along the axes [01$\bar{1}$] and [0$\bar{1}$1] and the line connecting the focus 0 and the center portion of the hemispherical surface indicates the [100] axis. A tangent to the spherical surface of the silicon crystal body at a point displaced by an angle $\theta$ from the basic [100] axis defines a crystal plane at the angle $\theta$, which is a crystal plane inclined the angle $\theta$ toward the [01$\bar{1}$] axis. Setting the angle $\theta$ at various values, the generation of the stacking faults on the respective crystal planes was examined.

Figure 2:
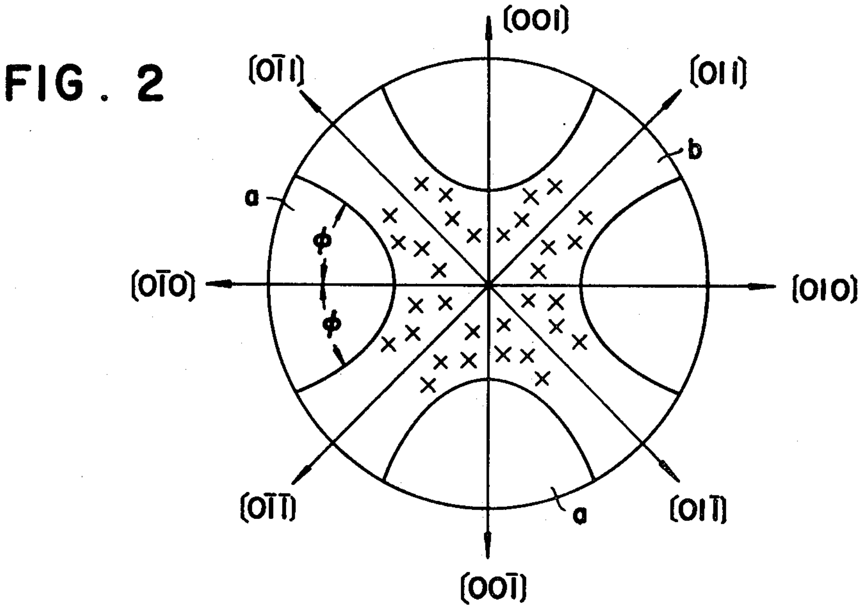
FIG. 2 is a plan view of the hemispherical monocrystalline silicon surface of FIG. 1(*a*) illustrating the distribution of stacking fault defects therein.

FIG. 2 shows an example of the distribution of the stacking fault defects observed by moving a microscope on the various crystal planes of the spherical silicon crystal surface, wherein the region indicated by *a* is the portion where no stacking fault defects appeared and the region indicated by *b* is the portion where the stacking fault defects appeared and, as is clear from FIG. 2, the stacking fault defects appear on the spherical portions in the directions of 4 crystal axes, namely axes [011], [01$\bar{1}$], [0$\bar{1}\bar{1}$] and [0$\bar{1}$1].

FIGS. 3(*a*) through 3(*e*) are photographs of silicon monocrystalline surfaces, the crystallographic orientation of each of which deviates by 0°, 2.5°, 5°, 7° and 10° from the [100] axis toward the [01$\bar{1}$] axis, and FIGS. 4(*a*) through 4(*e*) are photographs of the surfaces of epitaxially grown silicon monocrystalline bodies, the crystallographic orientation of each of which deviates by 0°, 2.5°, 5°, 7° and 10° from the [100] axis toward the [01$\bar{1}$] axis, after the thermal oxidization and the removal of silicon oxide film formed thereby.

As can be seen from the photographs, in case of the crystal plane inclined by 2.5° toward the [01$\bar{1}$] axis, the stacking fault defects which appear tend to be confined to one fault, the intersection with the silicon crystal plane of which is parallel to the [01$\bar{1}$] axis, and the one which is parallel to the [011] axis tends to dissappear. This tendency prevails up to an angle of 7° to 8° and, at an angle of approximately 10°, the stacking fault defects parallel to the [011] axis reappear, in the form of "V" patterns due to the displacement of the crystal orientation by 10° from the [100] axis, but shows a lower defect density than the one in the (100) plane. On the other hand, on the crystal plane inclined by an angle of 2.5° from the [100] axis toward the [001] axis (not shown in Figure), the stacking fault defects disappear and this tendency prevails to an angle of approximately 15° and the above result has been found to have reproducibility.

The generation and disappearance of the stacking fault defects described above, due to the crystallographic symmetry, have the same tendency between the crystal planes on the orthogonal crystal axes indicated in FIG. 1(*b*), but the fault density varies depending on the conditions of the thermal oxidation. For instance, it depends on the oxidation temperature, water vapor content supplied and minute surface damages or contaminations produced during surface preparation. In the experiment of the inventors, a mirror-like polished surface of the silicon crystal was oxidized under the most general conditions used in the manufacture of the semiconductor apparatus, that is, at an oxidation temperature of 1,200° C, a bubbler water temperature of 95° C and an oxygen flow rate of 1.0 l/min. and, after the removal of the oxide film, was etched to an extent of 1 to 2$\mu$. As a result of the examination, the density of the stacking fault defects, expressed as the average number per cm$^2$, was about $8.0 \times 10^3$ in the case of an angle not exceeding 2.5° and about $4.0 \times 10^3$ in the case of an angle of 3° to 8°.

In FIG. 2, the area with the mark X around the [100] axis is the portion where a large number of stacking fault defects as shown in FIGS. 3(*a*) and 4(*a*), appeared and such an area lies within an angle of about 2.5° corresponding to the angle $\theta$ of FIG. 1(*b*) and has the highest density of the stacking fault defects. At the regions where the deviation is approximately 10° off the [100] axis, the stacking fault defects are formed, but the density of which is reduced as compared to that in the vicinity of the [100] axis (not exceeding 2.5°). On the other hand, the portion *a* is completely free from the generation of the stacking fault defects. The portion *a* is defined by the angle $\theta$ exceeding 2.5° and the angle $\phi$, not exceeding about 35°, as shown in FIG. 5.

However, since the outstanding characteristics which the (100) plane provides are lost when the angle $\theta$ is too large, an angle up to about 15° is preferable in order to sufficiently utilize the characteristics.

As is clear from the above description, according to the present invention, it is possible to obtain a silicon crystal body having a crystal orientation with no influence from these stacking fault defects.

The present invention may be also employed for a silicon monocrystalline body the major surface of which is to be exposed to HF or HCl and the like to remove surface oxides or surface damaged layers. In FIG. 6, an NPN transistor employing such a crystal plane as its major surface according to the invention is shown.

To produce such a transistor, first a silicon monocrystalline ingot including N-conductivity-type-determining impurities is prepared with a diameter of about 50 millimeters by, for example, the pulling method. In this step, it is desirable that the pulling axis is coincident with the [100] direction. The ingot is then cut into a plurality of wafers with a flat plane perpendicular to the orientation of 4° off the [100] axis of the ingot and towards the [010] axis. In FIG. 6, layer 1 is a portion of one of the wafers thus produced having a resistivity of approximately 0.020 ohm cm. Epitaxial growth is preformed on the surface 2 of the wafer 1 to form an N-type silicon layer 3 having a resistivity of about 3 to about 50 ohm cm and the thickness of 13 to 17 microns. The surface 4 of the epitaxially grown layer 3 which has the crystallographic orientation deviating 4° from the [100] axis toward the [010] axis is exposed to a wet oxidizing atmosphere at about 1,000° C, whereby a silicon oxide film 5 having a thickness of about 6,000 angstroms is formed. It should be understood that the surface 4 is free from the stacking fault defects as described in the foregoing experiment. Using a photolithographic technique as usually employed, silicon oxide film is selectively engraved with an etchant, for example, an aqueous solution of HF or of HF and ammonium fluoride ($NH_4F$), to bore a hole for selective diffusion. By diffusing a P-type impurity such as boron into the epitaxially grown layer 3 through the hole, base region 6 having a surface concentration of about $6 \times 10^{18}$ atoms per cubic centimeter is formed. During the diffusion, new silicon oxide film 7 is formed in the hole with a thickness of about 5,000 angstroms, and then is selectively removed to expose a portion of the surface 4. An N-type impurity such as phospher is diffused into the exposed surface whereby an emitter region 8 having a surface concentration of about $2 \times 10^{21}$ atoms per cubic centimeter is formed. In the last, a hole for base electrode 10 is bored in the new oxide film 7, and emitter electrode 9, base electrode 10 and collector electrode 11 are attached on the corresponding surface portions.

The transistors thus manufactured have excellent electrical characteristics in particular the burst noise and/or 1/f noise are lowered in comparison with the transistor having a (100) plane as its major surface.

In accordance with the invention, the yield of low noise transistors or linear integrated circuit devices etc. is raised because of the avoidance of the defect that the breakdown voltage of the PN junction is deteriorated by the stacking fault defects crossing the PN junction.

Further, it is understood that also in MOS type transistors the percentage of short circuits which occur between source and drain is lowered.

It should be noted that the present invention is not limited to the particular embodiment and is applicable to any semiconductor devices having a PN junction.

We claim:

1. A process for manufacturing a semiconductor device comprising the steps of preparing a silicon monocrystalline body having a major surface having a crystal plane, except for the (810) plane and a plane deviating 1° therefrom, with a crystallographic orientation deviating 2.5° to 15° from the [100] axis toward an axis, in the (100) plane, selected from the group consisting of 0° to 35° off one of the axes [010], [001], [$0\bar{1}0$] and [$00\bar{1}$]; epitaxially depositing a silicon layer on said major surface of said silicon body from vapor phase; thermally oxidizing said silicon body, thereby an insulating film consisting essentially of silicon oxide is formed on said major surface of said body.

2. A process for manufacturing a semiconductor device comprising the steps of preparing a silicon monocrystalline body having a major surface having a crystal plane, except for the (810) plane and a plane deviating 1° therefrom, having a crystallographic orientation deviating 2.5° to 15° from the [100] axis toward an axis, in the (100) plane, selected from the group consisting of 0 to 35° off one of the axes [010], [001], [$0\bar{1}0$] and [$00\bar{1}$]; forming an insulating film consisting essentially of silicon oxide on said major surface of said body by thermally decomposing a silicon compound; and then subjecting the thus produced combination to a heat treatment.

3. A process for manufacturing a semiconductor device comprising the steps of preparing a silicon monocrystalline body having a major surface having a crystal plane, except for the (810) plane and a plane deviating 1° therefrom, with a crystallographic orientation deviating 2.5° to 15° from the [100] axis toward an axis, in the (100) plane, selected from the group consisting of 0° to 35° off one of the axes [010], [001], [$0\bar{1}0$] and [$00\bar{1}$], and heating said silicon monocrystalline body in an oxidizing atmosphere containing water vapor so as to oxidize said major surface of said body, thereby an insulating film consisting essentially of silicon oxide is formed on said major surface of said body.

4. A process for manufacturing a semiconductor device according to claim 3, further comprising the steps of selectively removing said insulating film so as to partially expose said major surface of said silicon body, and diffusing an impurity which determines a conductivity type opposite to that of said body into said body through said exposed portion of said major surface, thereby a PN junction terminating at said major surface is formed in said body.

5. A process for manufacturing a semiconductor device according to claim 4, wherein said major surface of said body has a crystallographic orientation deviating substantially 4° from the [100] axis.

6. A process for thermally oxidizing a silicon monocrystalline body which comprises the steps of mis-orienting the crystallographic orientation of the surface of said silicon monocrystalline body to 2.5° to 15° off the [100] axis toward an axis, in the (100) plane, selected from the group consisting of 0° to 35° off one of the axes [010], [001], [$0\bar{1}0$] and [$00\bar{1}$], except for the (810) plane deviating 1° therefrom, and thermally oxidizing said body in a wet oxygen atmosphere.

7. A process as defined in claim 4 wherein said silicon monocrystalline body has a crystallographic orientation deviating 2.5° to 4° from the [100] axis toward an axis, in the (100) plane, selected from the group consisting of 0° to 35° off one of the axes [010], [001], [$0\bar{1}0$] and [$00\bar{1}$].

8. A process for manufacturing a semiconductor device comprising the steps of preparing a silicon monocrystalline body having a major surface having a crystal plane, except for the (810) plane and a plane deviating 1° therefrom, with a crystallographic orientation deviating 2.5° to 15° from the [100] axis toward an axis, in the (100) plane, selected from the group consisting of 0° to 35° off one of the axes [010], [001], [$0\bar{1}0$] and [$00\bar{1}$], and forming an insulating film consisting essentially of silicon oxide on said major surface by heating said body to a temperature not less than 1,000°C. in a wet oxygen atmosphere.

* * * * *